United States Patent [19]
Ståhl et al.

[11] Patent Number: 6,034,873
[45] Date of Patent: Mar. 7, 2000

[54] SYSTEM AND METHOD FOR SEPARATING AIR FLOWS IN A COOLING SYSTEM

[75] Inventors: Lennart Ståhl, Plano, Tex.; John Francis Wallace, Jr.; John Carlenas Parraz, both of San Ramon, Calif.; Montford Henry Clark, Basking Ridge, N.J.; David Winn, Lafayette, Calif.

[73] Assignee: Ericsson Inc, Research Triangle Park, N.C.

[21] Appl. No.: 09/088,981

[22] Filed: Jun. 2, 1998

[51] Int. Cl.[7] .................................................... H05K 7/20
[52] U.S. Cl. ........................... 361/701; 165/80.3; 454/184
[58] Field of Search .................................. 174/15.1, 16.1; 454/184; 165/80.3, 80.4, 80.5, 903, 104.19, 104.33, 104.34; 62/414, 418, 419, 259.2; 361/678, 690, 696, 698, 701, 691–695; 29/729, 854, 592.1

[56] References Cited

U.S. PATENT DOCUMENTS

| | | |
|---|---|---|
| 3,749,981 | 7/1973 | Koltuniak . |
| 4,158,875 | 6/1979 | Tajima . |
| 4,306,613 | 12/1981 | Christopher . |
| 4,910,642 | 3/1990 | Downing . |
| 5,170,320 | 12/1992 | Pease . |
| 5,595,068 | 1/1997 | Amr . |

OTHER PUBLICATIONS

Stahl and Zirath, TELECOOL, a New Generation of Cooling Systems for Switching Equipment, Ericsson Review, vol. 4, 1992, p. 124–132.

*Primary Examiner*—Gerald Tolin
*Attorney, Agent, or Firm*—Jenkens & Gilchrist

[57] ABSTRACT

A cooling system and method employing separation chutes and baffles is disclosed. The separation chutes separate the cooled air descending from a heat exchanger positioned above heat-generating equipment in an equipment room from heated air ascending from the heat-generating equipment. Separation of the airflows reduces turbulence and increases cooling efficiencies. The separation chutes are made of a variety of materials, both rigid and flexible, for a variety of applications.

20 Claims, 8 Drawing Sheets

SYSTEM AND METHOD FOR SEPARATING AIR FLOWS IN A COOLING SYSTEM

CROSS REFERENCE TO RELATED APPLICATION

This application is related to U.S. Applications for Patent, Ser. No. 09/088755, filed Jun. 2, 1998, now U.S. Pat. No. 5,975,114 entitled "System, Method and Apparatus for Purging Fluid" Ser. No. 09/08933, filed Jun. 2, 1998, pending, entitled "Spray Hood Protector in a Fluid-Based Cooling System"; and Ser. No. 09/088958, filed Jun. 2, 1998, pending, entitled "Cooling System And Method for Distributing Cooled Air", the disclosures of which are incorporated herein by reference.

BACKGROUND OF THE INVENTION

1. Technical Field of the Invention

The present invention relates to cooling systems for cooling electronic equipment, particularly to cooling systems employing suspended climate control systems using natural convection.

2. Background and Objects of the Invention

The growth of the computer industry and telephony over the past few decades has been phenomenal. The integration of these technologies, for example, in telecommunications switching systems, has lead to greater and greater efficiencies as larger numbers of communications are handled by fewer components, which are typically housed in a central control room.

One problem inherent with all electronic equipment, telecommunications or otherwise, is temperature control. As is readily apparent, if telecommunications switching equipment or other electronic components are not effectively cooled, high internal temperatures are quickly reached with total system shutdown soon following. Conventional approaches to cooling the aforementioned central control or other such apparatus/equipment rooms have utilized controlled cooling systems employing motor-driven fans and heat exchangers.

Another approach used for temperature control is to exploit the properties of natural convection, by which ambient air heated by the equipment flows upwards and then downwards through a heat exchanger, which cools the air, back to the heat generating equipment, beginning the cycle anew. One advantage of using cooling systems employing natural convection is the elimination of the operational disturbances and operating costs associated with the aforementioned controlled cooling systems.

Swedish Patent Specification No. 8404878-4 describes a heat exchange system that exploits natural convection by utilizing a chimney effect, i.e., channeling the rising air such as is done in a chimney, conducting the air flow through a heat exchanger and past heat-exchanging fins and tubes thereof. This arrangement, however, is directed to outdoor installations whereby a liquid medium flowing through heat-exchanger tubes is first cooled by colder outside air and then used to cool an equipment room.

It is, therefore, an object of the present invention to provide an improved configuration for a heat exchange system employing natural convection.

It is also an object of the present invention that the improved configuration be adaptable for a variety of equipment room layouts and adjustable to maximize the efficiency of the cooling system.

SUMMARY OF THE INVENTION

The present invention is directed to a cooling system employing separation chutes or baffles. The separation chutes separate the cooled air descending from a heat exchanger suspended above heat-generating equipment in an equipment room from heated air ascending from the heat-generating equipment. Separation of the airflows reduces turbulence and increases cooling efficiencies. The separation chutes are made of a variety of materials, both rigid and flexible, for a variety of equipment room configurations.

BRIEF DESCRIPTION OF THE DRAWINGS

A more complete understanding of the system and method of the present invention may be had by reference to the following detailed description when taken in conjunction with the accompanying drawings wherein.

DETAILED DESCRIPTION OF THE PRESENTLY PREFERRED EXEMPLARY EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
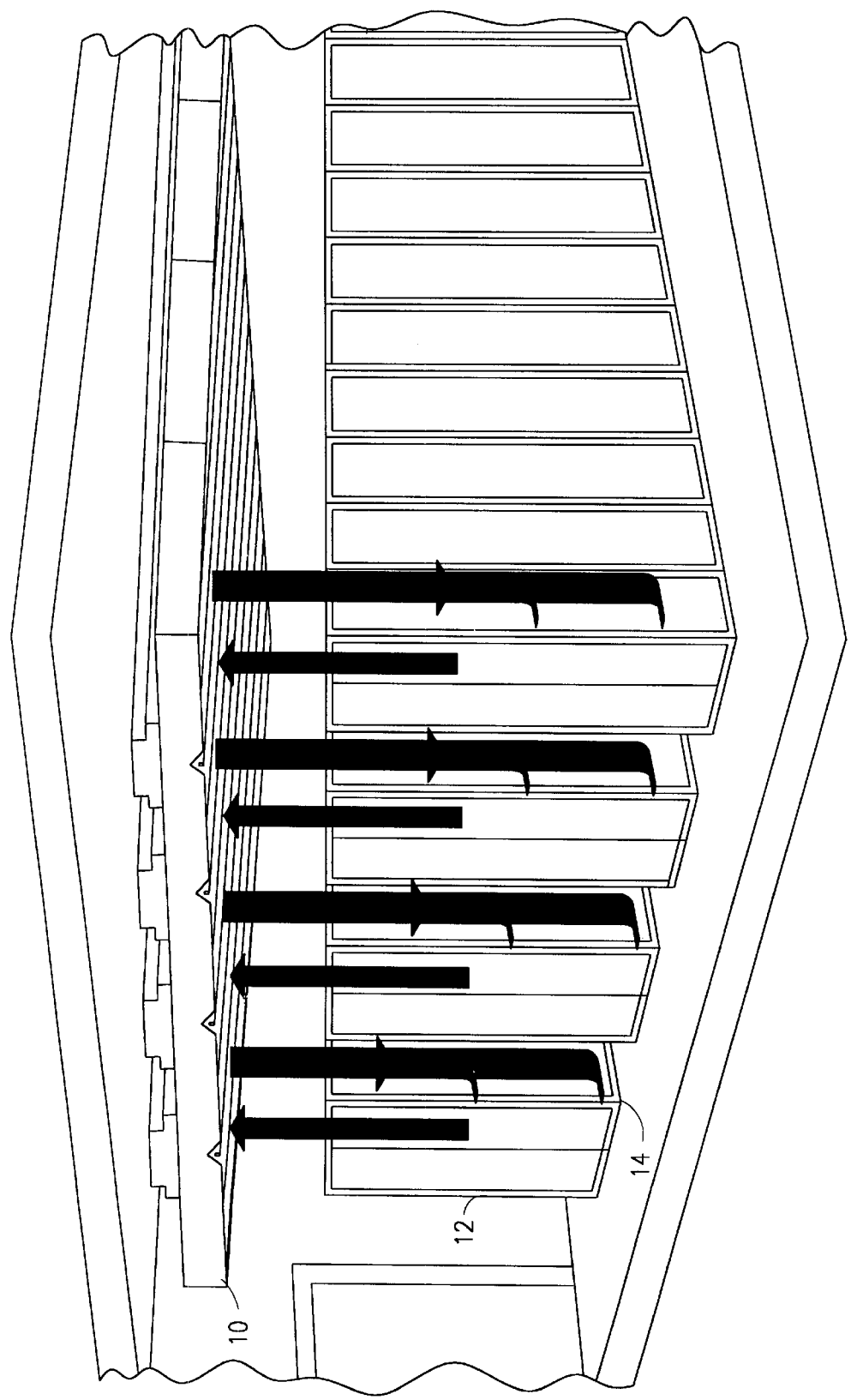
FIG. 1 is an illustration of a conventional, natural convection-based cooling system for an equipment room.

With reference now to FIG. 1, there is illustrated an equipment room with an overhead climate system 10 such as employed by Assignee and generally described in the aforementioned Swedish Patent Specification No. 8404878-4. As shown in FIG. 1, a number of rows of equipment 12 such as stored in cabinets are separated from each other by respective aisles, generally designated by the reference numeral 14, whereby a technician may access the equipment components. The aisles 14 also serve as convection pathways where cooled air from the overhead climate system 10 descends before entering the various equipment 12, as generally illustrated by the downward-pointing arrows. The air warmed by the equipment 12 rises to meet the climate system 10 which is preferably suspended from the ceiling or otherwise disposed above the equipment 12.

Figure 2:
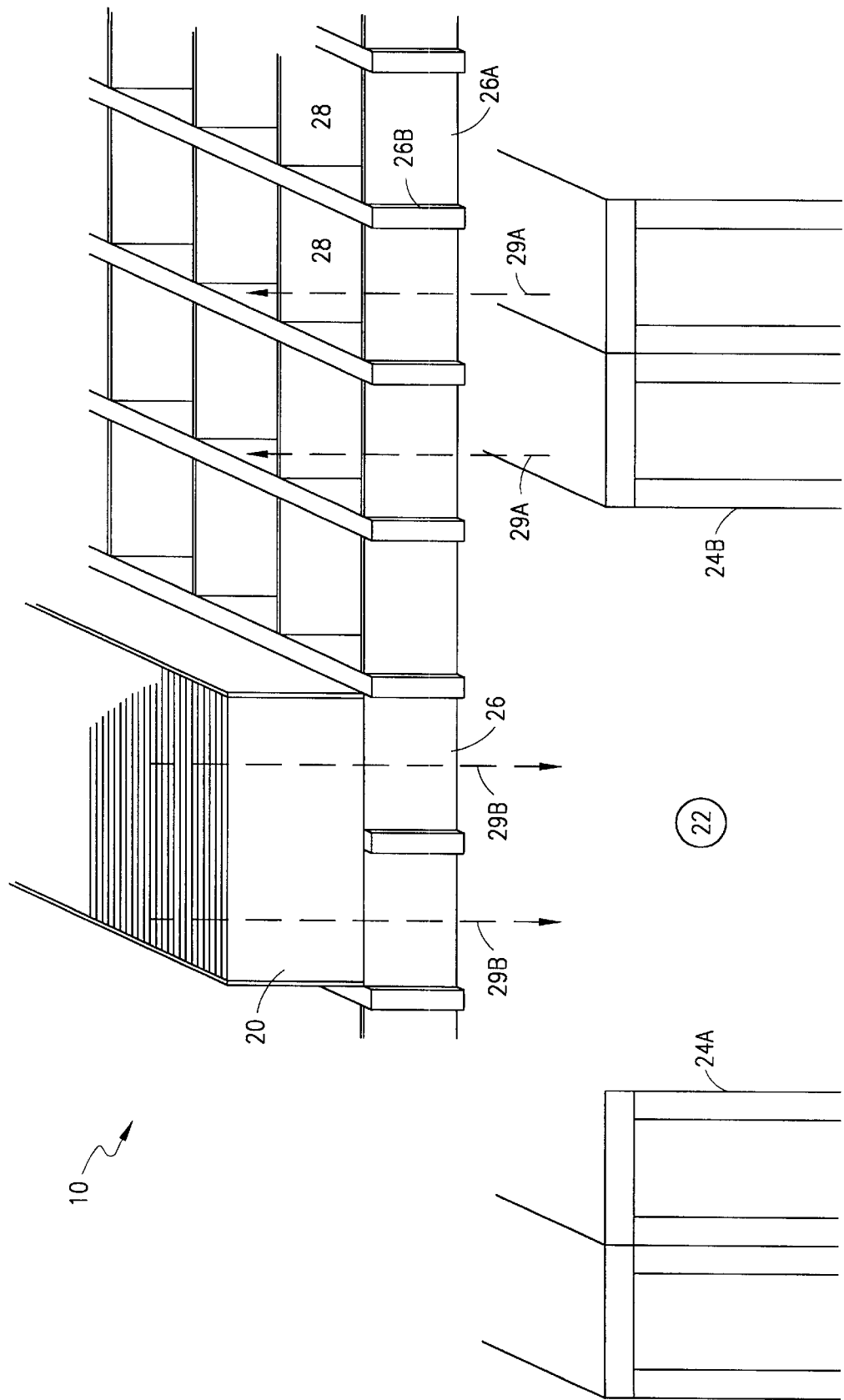
FIG. 2 is an illustration of a conventional climate control system used in the cooling system of FIG. 1.

With reference now to FIG. 2, there is further illustrated in more detail the overhead climate system 10 shown in FIG. 1. A conventional heat exchanger or cooling coil 20, such as one employing cold water or other liquid, is shown generally disposed above an aisle 22 between two rows of equipment cabinets 24A and 24B housing heat-generating devices therein. The overhead climate system 10 of the Swedish patent application further employs a support structure 26 upon which a number of the aforementioned cooling coils 20 rest above respective aisles 22 (for convenience, only one cooling coil 20 is shown). In a preferred embodiment of the present invention the support structure 26, which is suspended from the ceiling of the equipment room in a conventional manner, as shown in FIG. 1, is composed of a number of parallel 26A and perpendicular 26B panels or baffles, forming a number of discrete open channels or chutes 28 through which the rising heated and descending cool air flows, generally designated by the reference numerals 29A and 29B, respectively. It should be understood that the various open channels 28 form respective chimneys which enhance the natural convection effect somewhat.

Figure 3:
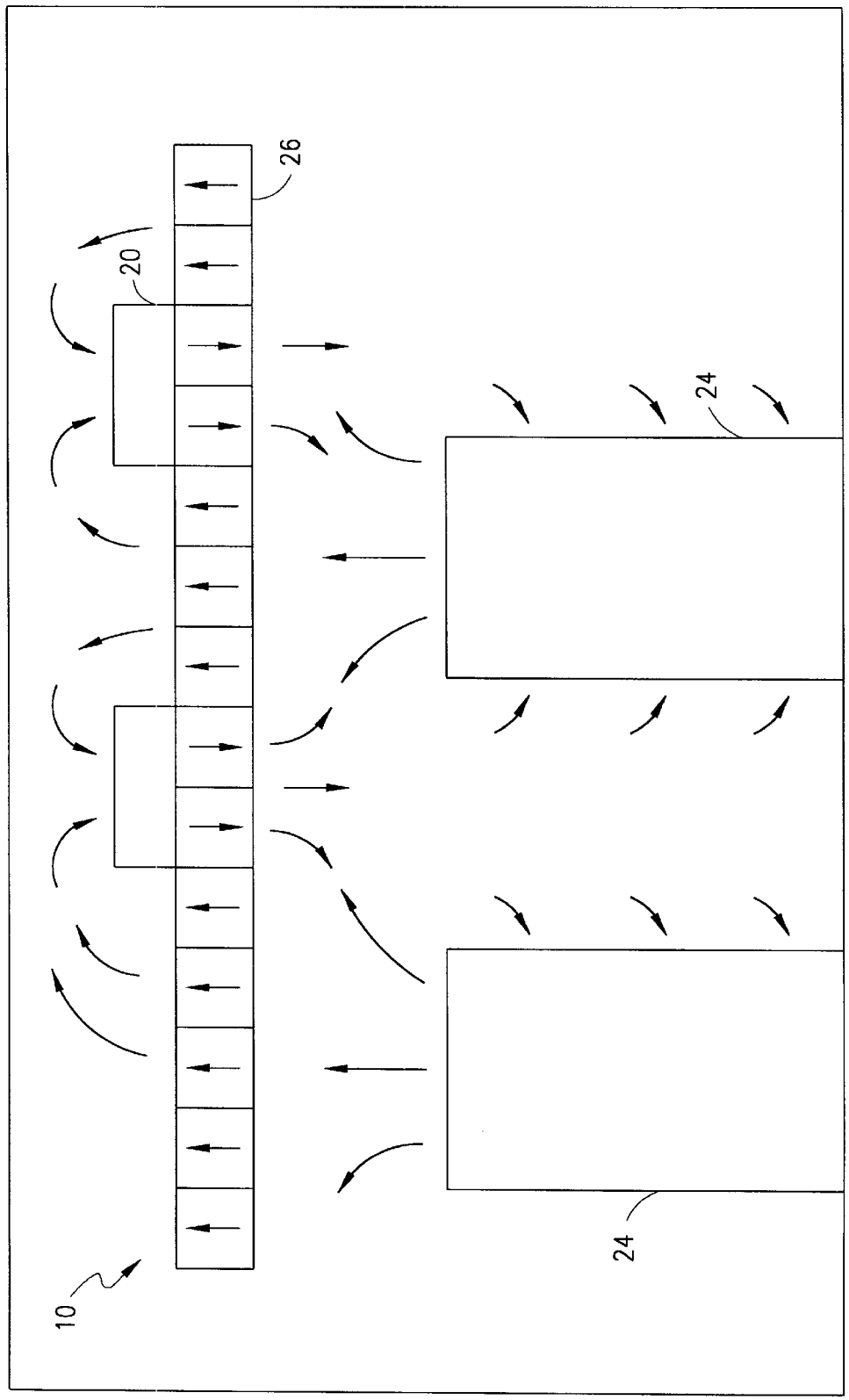
FIG. 3 is a representative illustration of airflows present in the conventional cooling system configurations of FIGS. 1 and 2.

A problem with the aforedescribed climate system described in connection with FIGS. 1 and 2, however, is that although the open chutes 28 generally channel the respective ascending 29A and descending 29B air flows, with the cooling coils 20 only generally suspended over the aisles 22, the downward-flowing 29B and upward-flowing 29A air flows are intermixed, creating turbulence and loss of efficiency. This inefficiency and turbulence is shown by numerous intersecting arrows in FIG. 3, illustrating the conflicting air flows. By incorporating the improved configuration of the present invention, however, the respective divergent air flows are separated, turbulence reduced or eliminated and efficiencies significantly increased over the prior structure.

Figure 4:
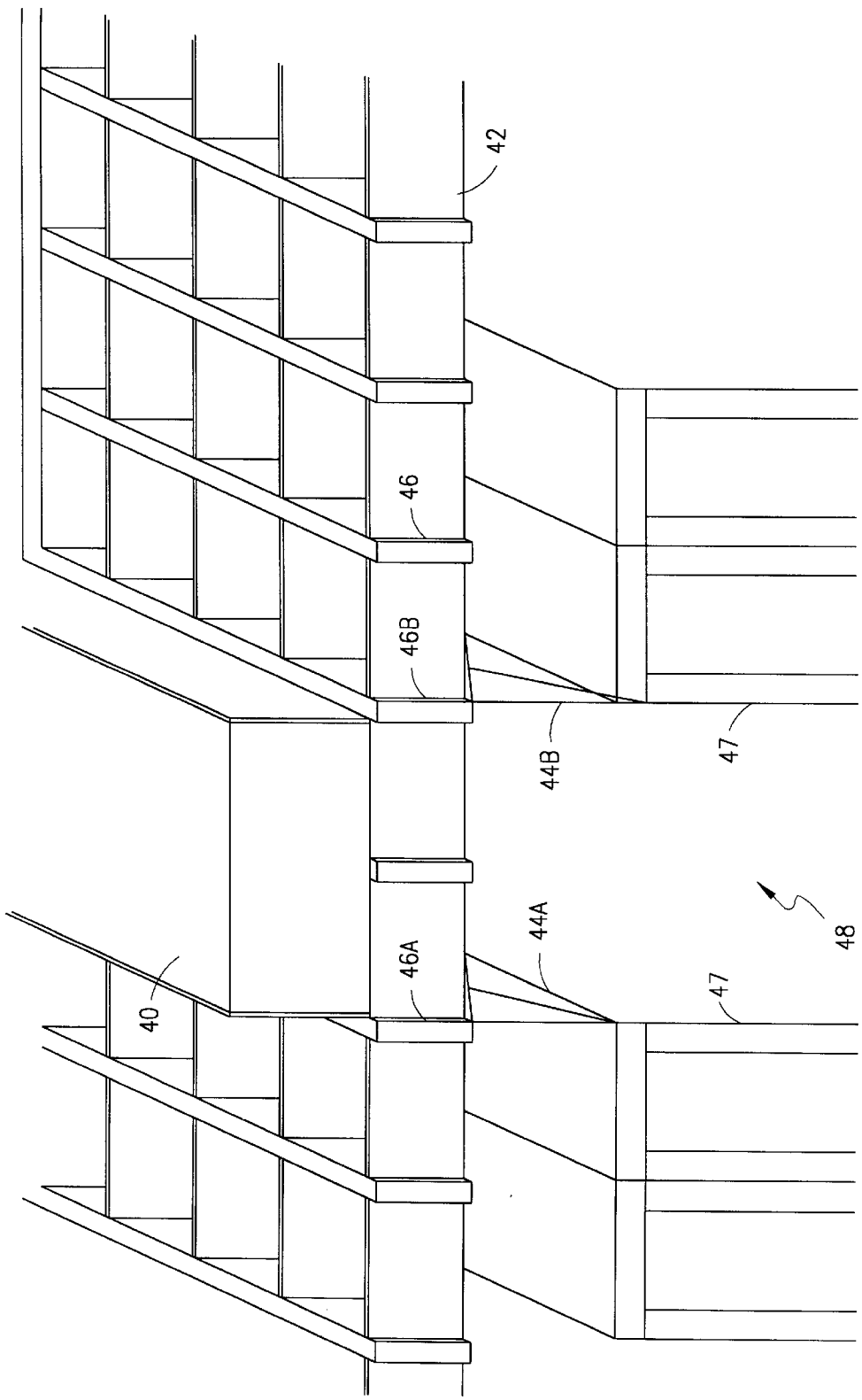
FIG. 4 is an illustration of the improved cooling system of the present invention which employs separation chutes.

With reference now to FIG. 4, there is illustrated one embodiment of the aforementioned configurational improvements over the art. In particular, a cooling coil 40, suspended over a support structure 42 substantially as described in connection with FIG. 2, draws the ambient air therethrough from above. The cooled air then flows downward through respective chutes of the support structure 42 underneath the cooling coil 40. Instead of intermixing with the rising warm air, however, as shown in FIG. 3, a pair of separation chutes 44A and 44B, channel the descending air directly downward without mingling with the ascending air flows, as shown in more detail in FIG. 5. Preferably, the separation chutes 44 extend along the sides of the cooling coil 40, e.g., from outer panels 46A and 46B, to the inner edges of heat generating equipment 47, i.e., along an aisle 48 therebetween.

With reference again to FIG. 5, it is clear that by separating the airflows, the aforedescribed chimney effect of natural convection through the suspended support structures 42 is further enhanced, creating a much improved, more efficient, turbulence-free cooling system than that of the prior art described above and illustrated in FIGS. 1–4.

Figure 6:
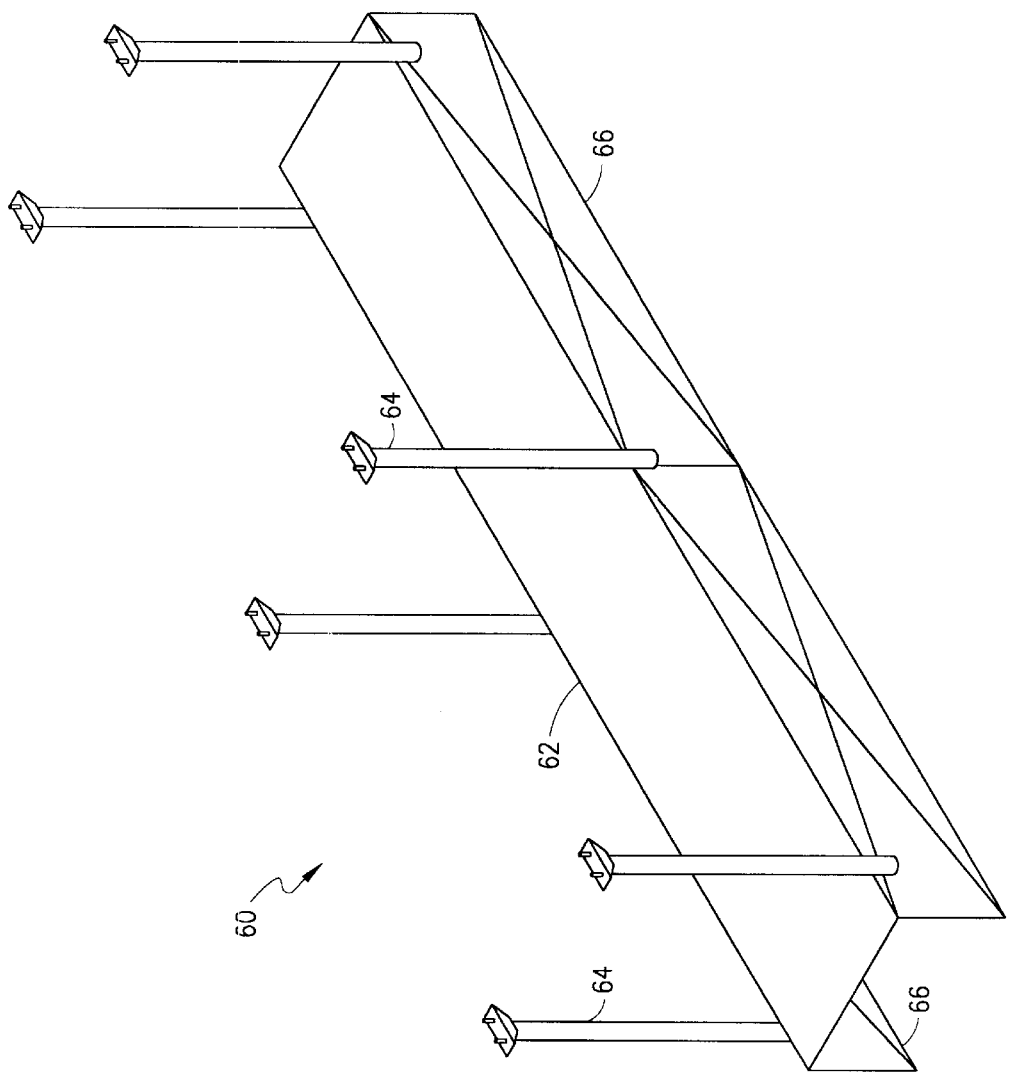
FIG. 6 is an illustration of an alternative configuration of the present invention.

In an alternative preferred configuration shown in FIG. 6, no elaborate support structure 42 is suspended over the equipment room. Instead, the system and method of the present invention may employ discrete overhead supports, generally designated by the reference numeral 60, to support one or more cooling coils 62 thereon. Suspension bars 64 may be employed to support the support 60 by anchoring it to the ceiling, suspending the support 60 (with cooling coil 62 thereon) over a respective aisle (not shown). Separation chutes 66 are secured to the sides of the support 60 and hang therefrom. In a preferred implementation of the embodiment shown in FIG. 6 a unistrut construction is employed.

The separation chutes 44 and 66 are preferably made of a light-weight material, e.g., 18 gage galvanized steel, flame-proof plastic or other material capable of diverting air flows. As discussed, the separation chutes 44 and 66 are preferably hung from the support structure 42 and 60 or the cooling coil 40 and 62, respectively, preferably using the aforementioned unistrut construction where each separation chute 66 is supported from parallel support bars (unistruts) under or alongside the cooling coil 62 so that the respective chutes 66 can be moved sideways along the support bar as required. It should also be understood that the preferred length of the chutes 66 is substantially the same as a respective cooling coil 62, allowing some measure of uniformity.

Figure 5:
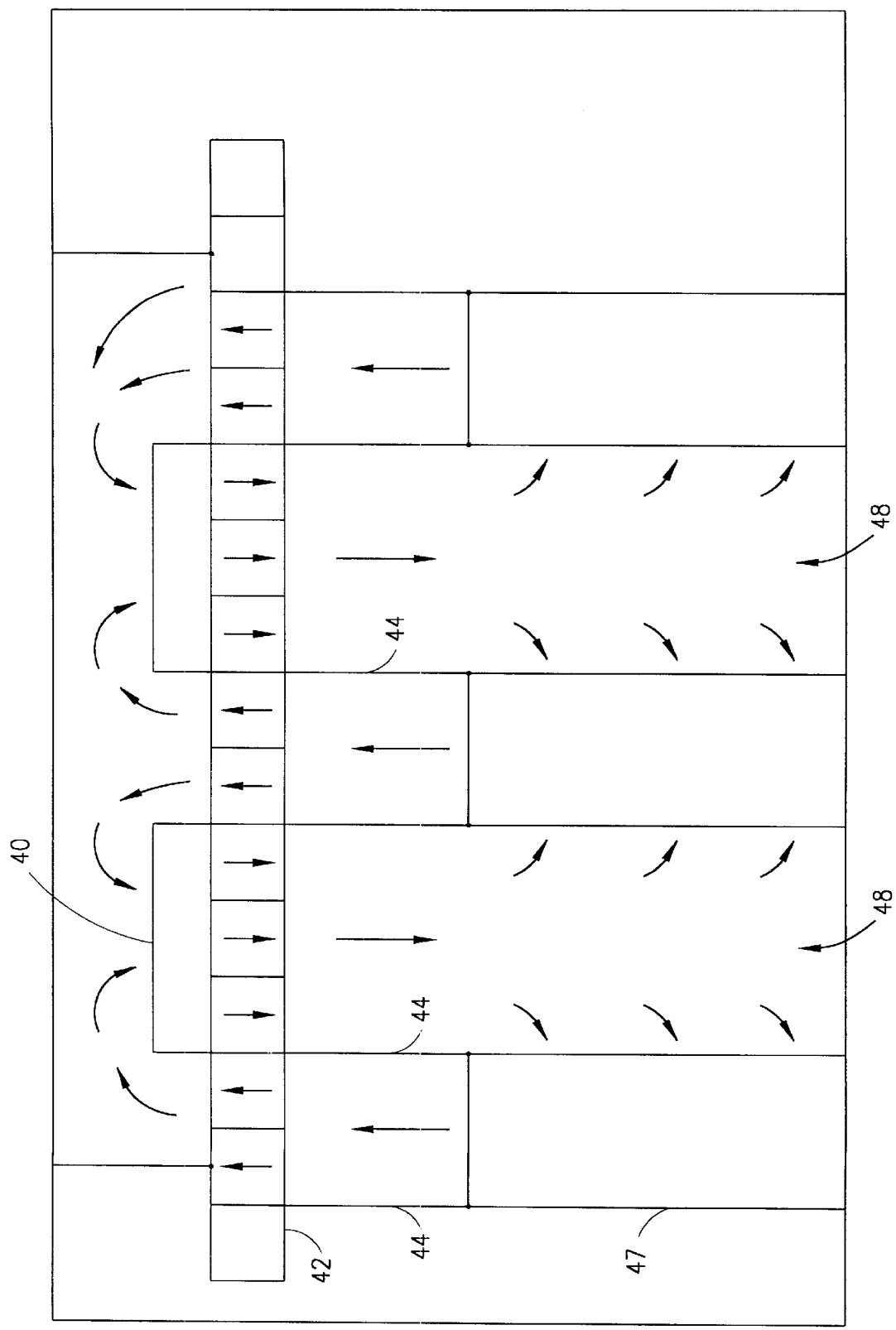
FIG. 5 is a representation illustration of airflows present in the improved cooling system configuration of FIG. 4.

With reference again to FIGS. 4 and 6, the separation chutes 44 and 66 may also be of a flexible construction and adaptable to various equipment 47 layouts, aisle 48 widths and cooling coil 40 and 62 positions to optimize airflow. For example, where the cooling coil 40 width substantially matches the width of the aisle 48 below, the separation chutes 44 may hang substantially vertically, as illustrated in FIGS. 4–6. Since the distance from the support structure 42 and the top of the equipment 47 is substantially constant, a rigid separation chute 44 and 66, such as made of steel, may be employed.

Figure 7:
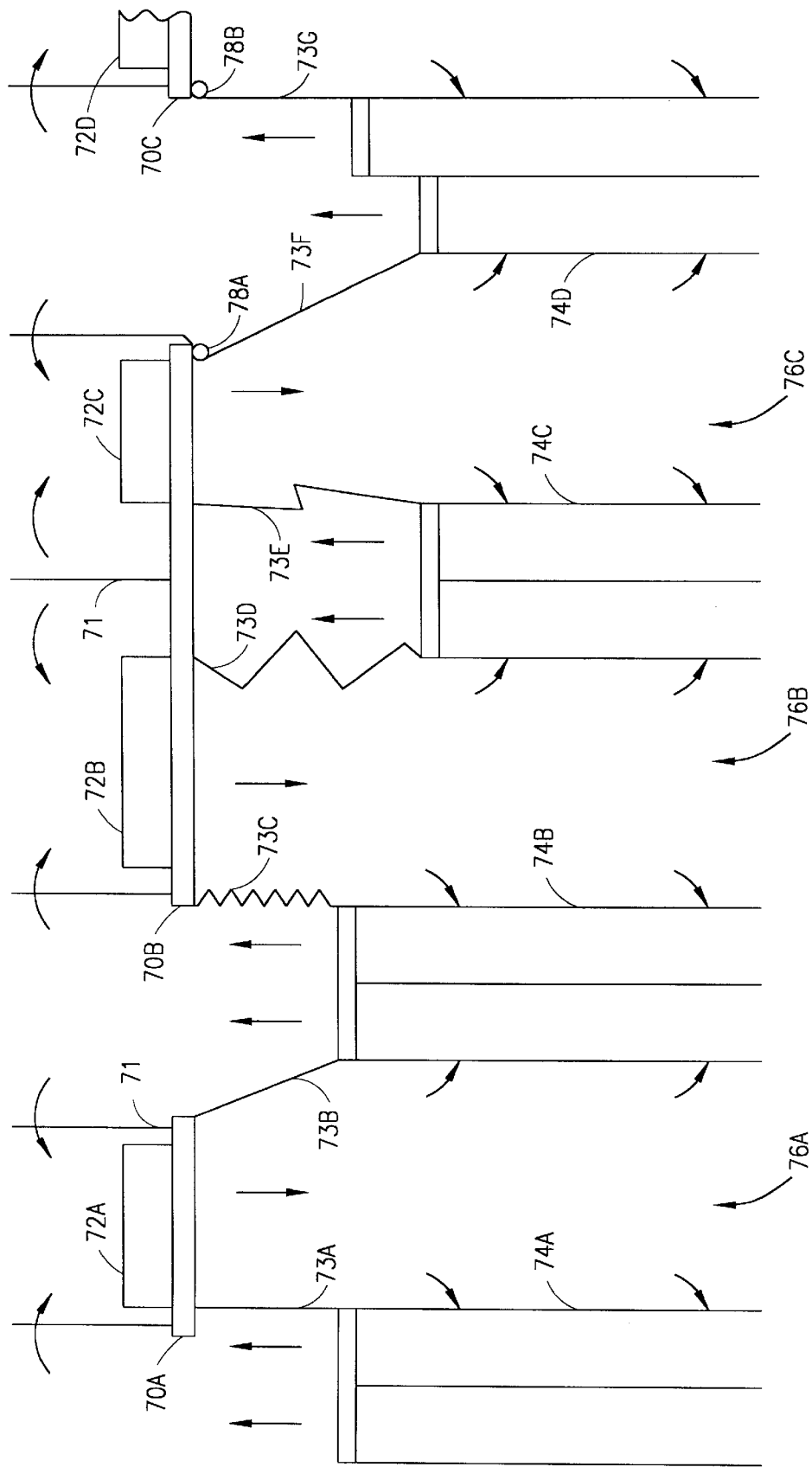
FIG. 7 illustrates various embodiments for implementing the improved cooling system according to the present invention.

Shown in FIG. 7, however, are alternate embodiments of the present invention illustrating various additional methodologies to effectuate the improvements of the present invention in separating the divergent air flow. As shown, a number of overhead supports, e.g., 70A, 70B and 70C, have support cooling coils 72A, 72B, 72C and 72D thereon, as indicated in the figure. Suspension bars 71 support the supports 70 as discussed in connection with FIG. 6. Rigid separation chutes 73A and 73B are secured to support 70A along one edge and to respective equipment 74A and 74B along another edge. As shown in FIG. 7, cooling coil 72A is disposed over an aisle 76A formed between the equipment 74A and 74B. Chutes 73A and 73B may, therefore, be made of a rigid material, such as steel, and whereas chute 73A is substantially vertically-disposed as in FIGS. 3–6, chute 73B is at an angle. Consequently, the height displacements of the chutes 73A and 73B from the support 70A to the respective equipment 74A and 74B differ, necessitating the selection of a chute 73 having the proper length to optimally channel the descending air.

One way to overcome the problem of variable vertical and angular displacement is to construct the chute 73 out of an expandable, accordion-like material, such as a plastic or a substantially non-air-permeable membrane. Chutes 73C and 73D are such accordion chutes, which are secured to support 70B (with supporting cooling coil 72B thereon) and equipment 74B and 74C, respectively. Chute 73D shows the chute in an extended position. Chute 73E is a two-piece, extendable chute which is secured to the support 70B under cooling coil 72C, and which may be made of a rigid material as with chutes 73A and 73B with an expansion component between the two pieces, which may be made of a flexible membrane material as with chutes 73C and 73D. Another mechanism for varying the height or vertical displacement is to employ a "roller blind", by which a flexible material or membrane may be rolled or extended from a roller 78 and secured at the extended end to another equipment 74D, which may have cabinets of variable height, as shown. In particular, a chute 73F extends from a roller 78A and a chute 73G extends from a roller 78B, both to the equipment 74D. It should also be understood that any of the aforedescribed chutes 73 may also move along a track along the underside of the support 70 and the edges of the underlying equipment 74, which is perpendicular to the various embodiments illustrated in FIG. 7, such as with the aforementioned unistrut construction.

Figure 8:
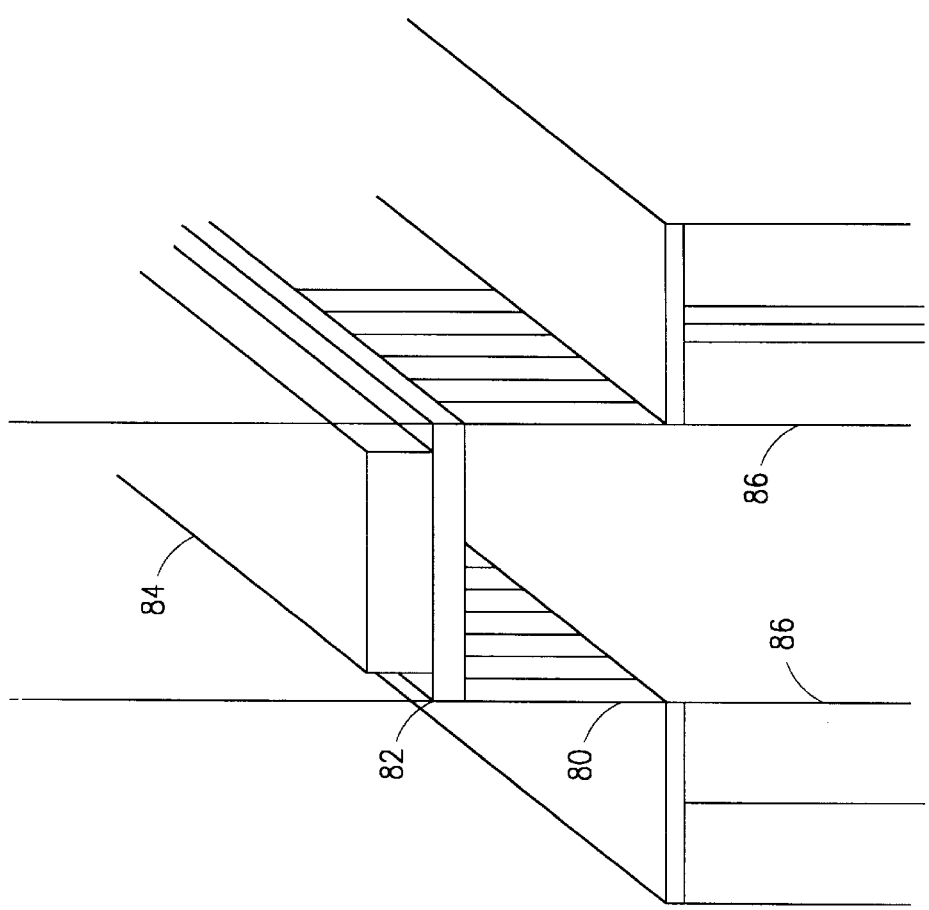
FIG. 8 illustrates another embodiment of the present invention.

With reference now to FIG. 8, instead of the integral separation chute 44 and 66 construction, shown in FIGS. 4 and 6, respectively, the chutes may be formed of multiple bands or sheets 80 of flexible material aligned to separate airflow as with the aforedescribed panels. The discrete bands 80 may be attached to a support 82, upon which a cooling coil 84 rests, and to respective equipment 86 therebelow. The bands 80 preferably overlap to better contain, control and separate the divergent air flows. An advantage of this approach is that one may reach through the chute during, for example, maintenance work or installation. Additionally, one may run cables or other wires through the chute bands 80 unlike that of the aforedescribed integral, panel chutes 44 and 66.

Although preferred embodiments of the system and method of the present invention have been illustrated in the accompanying drawings and described in the foregoing detailed description, it will be understood that the invention is not limited to the embodiments disclosed, but is capable of numerous rearrangements, modifications and substitutions without departing from the spirit of the invention as set forth and defined by the following claims.

What is claimed is:

1. A cooling system for cooling at least one heat generating device in an equipment room, said cooling system comprising:

heat exchange means for cooling ambient air warmed by said at least one heat generating device;

a support structure positioned above said at least one heat generating device and supporting said heat exchange means thereon, said support structure being permeable to air and having a plurality of regions, at least one of said regions being covered by said heat exchange means, whereby cooled air flowing therethrough descends downward to said at least one heat generating device, and at least one other region adjacent said at least one region whereby said air warmed by said at least one heat generating device may ascend therethrough; and separation means for separating the descending airflows, from said heat exchange means over said at least one region through said support structure and between said support structure and said heat generating device, from the ascending airflows from said at least one heat generating device, between said heat generating device and said support structure and through said at least one other region of said support structure.

2. The cooling system according to claim 1, wherein said separation means comprises a plurality of separation chutes at least one of said separation chutes extending from said support structure substantially to said heat generation device, whereby said at least one separation chute separates descending airflows from ascending airflows.

3. The cooling system according to claim 2, wherein said heat exchange means comprises a plurality of heat exchangers disposed on said support structure, a first of said heat exchangers being substantially parallel to a second of said heat exchangers forming a first and a second downward-flowing region, respectively, and an upward-flowing region therebetween, a first and a second separation chute being attached to said support structure along the joinder of said first and second downward-flowing regions to said upward-flowing region, said separation chutes suspending from said support structure and attached to a given heat generating device in said equipment room, whereby said first and second separation chutes divide respective airflows descending downwards from said first and second heat exchangers from ascending airflows from said heat generating devices.

4. The cooling system according to claim 2, wherein said heat exchange means comprises at least one heat exchanger disposed on said support structure forming a downward-flowing region, a first and second upward-flowing region being adjacent said downward-flowing region, respectively, a first and a second separation chute attached to said support structure, along the joinder of said first and second downward-flowing regions to said upward-flowing region, said separation chutes suspending from said support structure and attached to respective heat generating devices in said equipment room, whereby said first and second separation chutes divide airflow descending downwards from said heat exchanger from respective ascending airflows from said heat generating devices.

5. The cooling system according to claim 2, wherein said separation chutes are composed of metal.

6. The cooling system according to claim 2, wherein said separate chutes are composed of a flexible, substantially non-air-permeable membrane.

7. The cooling system according to claim 1, wherein said support structure is suspended from the ceiling of said equipment room.

8. A cooling system for cooling at least one heat generating device in an equipment room, said cooling system comprising:

heat exchange means for cooling ambient air warmed by said at least one heat generating device;

a support structure supporting said heat exchange means thereon, said support structure being positioned substantially above a first of said at least one heat generating devices, said ambient air warmed by said first heat generating device ascending upward around said support structure and then descending downward through said heat exchange means, whereby the air flowing through said heat exchange means is cooled and descends downward to said first heat generating device; and separation means for separating the descending airflow, from said heat exchange means between said support structure and said heat generating device, from the ascending airflow from said first heat generating device, between said first heat generating device and said support structure.

9. The cooling system ascending to claim 8, wherein said separation means is a separation chute attached to said support structure and said first heat generating device.

10. The cooling system according to claim 9, wherein said separation chute is composed of metal.

11. The cooling system according to claim 9, wherein said separation chute is composed of a flexible, substantially non-air-permeable membrane.

12. The cooling system according to claim 11, wherein said flexible separation chute is expandable to connect said support structure to said first heat generating device.

13. The cooling system according to claim 9, wherein said separation chute hangs substantially vertically from said support structure to said first heat generating device.

14. The cooling system according to claim 9, wherein said separation chute hangs at an angle from vertical from said support structure to said first heat generating device.

15. The cooling system according to claim 9, wherein said separation chute is expandable to connect said support structure to said first heat generating device.

16. The cooling system according to claim 15, further comprising a roller blind attached to said support structure, said separation chute being attached along one edge to said roller blind and along another edge to said heat generating device.

17. The cooling system according to claim 8, further comprising a second heat generating device substantially parallel to said first heat generating device forming an aisle therebetween, said support structure being positioned substantially above said aisle, whereby said descending cooled airflow flowing through said heat exchange means on said support structure descends downward to said first and second heat generating devices, and said warmed ascending airflows are separated from said descending airflow by said separation means.

18. The cooling system according to claim 17, wherein said separation means comprises a first and a second separation chute each attached at one edge to said support structure and along a second edge to said first and second heat generating devices, respectively.

19. The cooling system according to claim 8, wherein said separation means comprises a plurality of discrete bands, each said band being connected along one edge to said support structure and along another edge to said first heat generating device.

20. A method for cooling at least one heat generating device in an equipment room, said method comprising the steps of:

obtaining a separation chute; and attaching said separation chute along one edge to a support structure, said support structure supporting a heat exchange means thereon for cooling ambient air warmed by said at least one heat generating device, and along another edge to a first of said heat generating devices, whereby the ascending ambient air warmed by said at least one first heat generating device is separated from descending air cooled by said heat exchange means.

* * * * *